United States Patent [19]
Tanaka et al.

[11] Patent Number: 5,325,414
[45] Date of Patent: Jun. 28, 1994

[54] X-RAY MASK ALIGNMENT METHOD AND APPARATUS THEREFOR AS WELL AS X-RAY MASK TO BE USED TO SAID METHOD AND SAID APPARATUS

[75] Inventors: Toshihiko Tanaka; Koichi Okada, both of Tokyo, Japan

[73] Assignee: Sortec Corporation, Tokyo, Japan

[21] Appl. No.: 70,081

[22] Filed: May 28, 1993

Related U.S. Application Data

[63] Continuation-in-part of Ser. No. 816,397, Dec. 27, 1991, abandoned.

Foreign Application Priority Data

Feb. 1, 1991 [JP] Japan .................. 3-031300

[51] Int. Cl.$^5$ ............................. G21K 5/00
[52] U.S. Cl. ........................ 378/34; 378/35; 378/206
[58] Field of Search ............ 378/34, 35, 205, 206; 250/492.2; 356/349, 363, 399, 400

[56] References Cited

U.S. PATENT DOCUMENTS 5,182,610  1/1993  Shibata ..................... 356/349

FOREIGN PATENT DOCUMENTS 0176117  8/1986  Japan ....................... 378/34

OTHER PUBLICATIONS

Handling Explanation of Canon FPA 2000 i1 (in Japanese; English Translation also supplied) no date.

*Primary Examiner*—David P. Porta
*Attorney, Agent, or Firm*—Nields & Lemack

[57] ABSTRACT

X-ray alignment method and apparatus therefor characterized by separately irradiating alignment light to alignment patterns of an X-ray mask and detecting reflected light therefrom, and directly irradiating alignment light to alignment patterns of a wafer and detecting the reflected light therefrom, and aligning the X-ray mask and the wafer in accordance with the detecting data of the reflected light. The apparatus includes a position alignment mechanism for the mask stage and the wafer stage, which moves the X-ray mask and/or the wafer and provides the alignment therebetween. The apparatus includes independent light sources for irradiating the alignment patterns of the X-ray mask side and the wafer side, independent detectors for detecting the reflected light of the alignment patterns of the X-ray mask and the wafer, and a controller for analyzing the respective positions of the X-ray mask and the wafer in accordance with the detection data and issuing control signals to the position alignment mechanism. The X-ray mask used in the alignment method and apparatus is transparent to only X-rays.

6 Claims, 4 Drawing Sheets

FIG_1
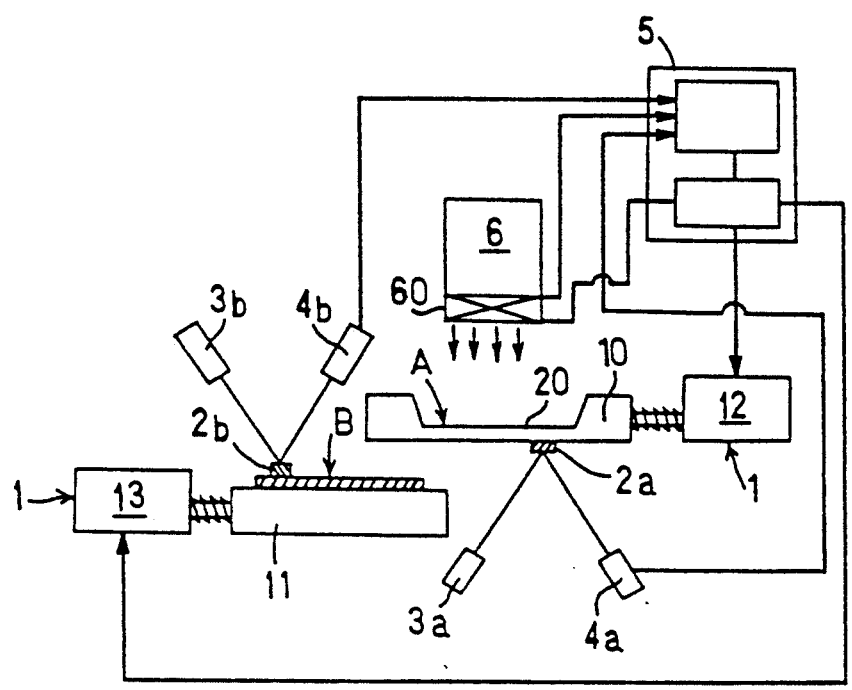
FIG_2
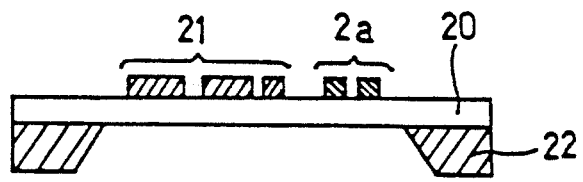

FIG_3
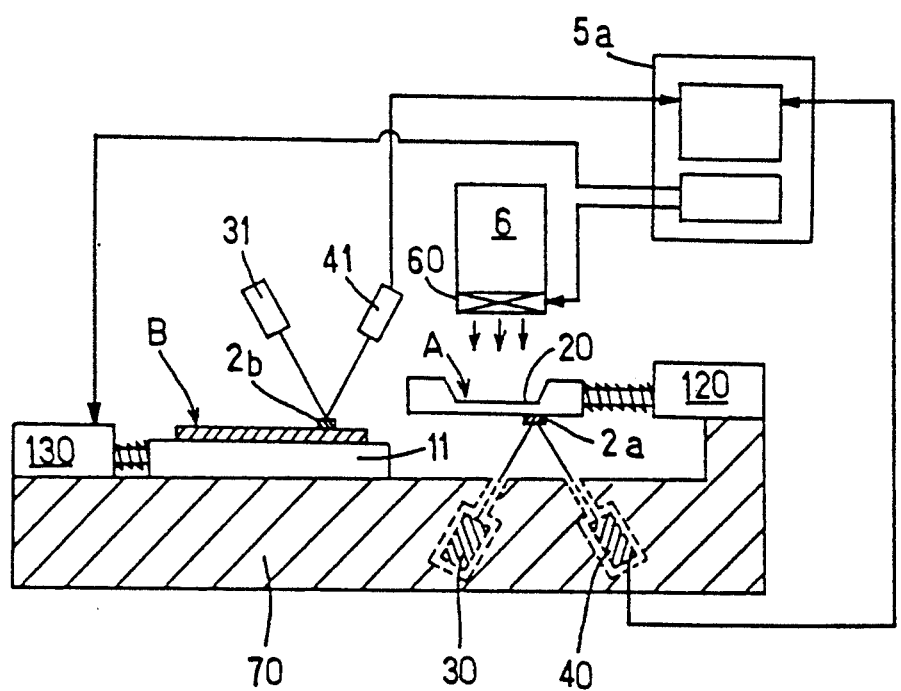

FIG_4 (PRIOR ART)
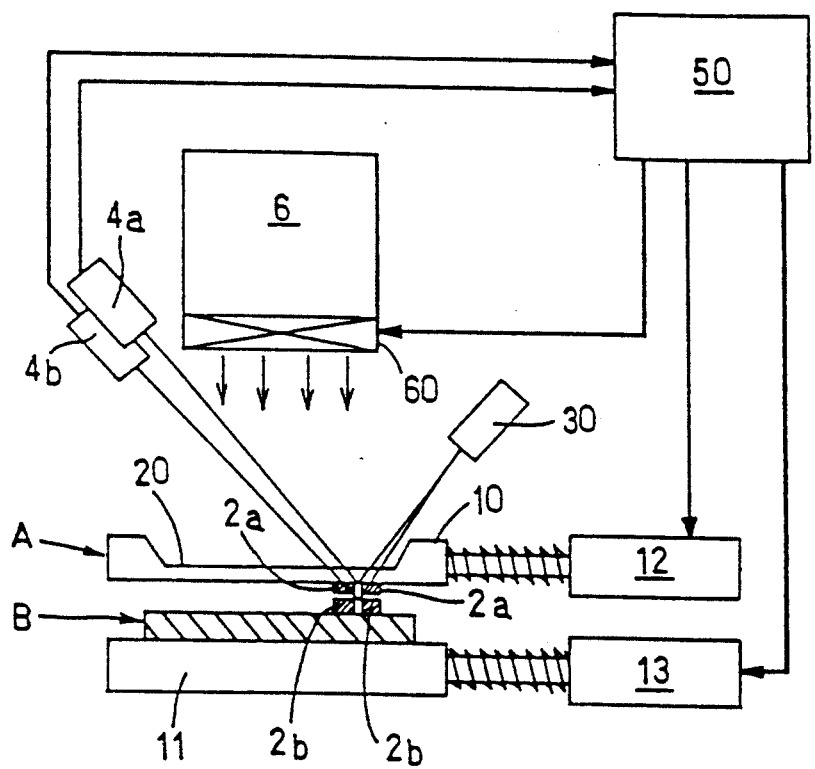

FIG_5
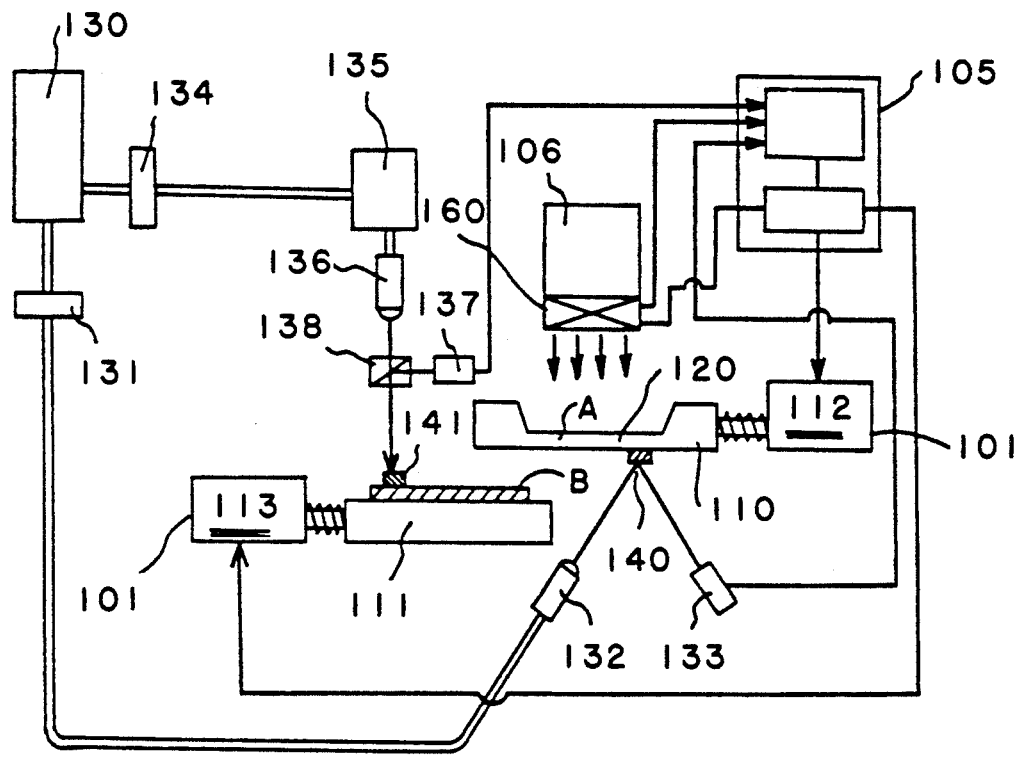

5,325,414

X-RAY MASK ALIGNMENT METHOD AND APPARATUS THEREFOR AS WELL AS X-RAY MASK TO BE USED TO SAID METHOD AND SAID APPARATUS

This application is a continuation-in-part of U.S. Ser. No. 07/816,397 filed Dec. 27, 1991.

INDUSTRIAL APPLICATION FIELD

The present invention relates to an X-ray mask alignment method to be applied to an X-ray lithography and an apparatus therefor as well as an X-ray mask to be used thereto.

PRIOR ART

With respect to the X-ray mask alignment method, studies have been made on such a method which irradiates in one shot the lights passing through the X-ray mask membrane toward alignment patterns on a mask and alignment patterns on a wafer, and detect diffracted lights reflected from the both patterns for carrying out an as-placed position alignments (which is a method of detecting the alignment patterns on the mask and the alignment patterns on the wafer and superimposing them, and after having carried out the superimposing, exposuring the mask and the wafer by fixing the mask not to move them) and in particular a main stream has been a practice which provides the alignments by means of interferometric image, using an optical heterodyne position detecting system.

FIG. 4 is an explanatory view showing one example of the position alignment methods of the X-ray mask A and wafer B by means of said as-placed position alignments. There are very closely arranged in column a mask stage 10 and a wafer stage 11 in order from an X-ray source 6, where the X-ray mask A formed with alignment patterns 2a is secured on the mask stage 10, while the wafer B formed with the alignment patterns 2b is attracted on the wafer stage 11 under a condition that the wafer B approaches the mask A by keeping an exact gap therefrom. The both stages may be moved by driving system 12, 13 which are actuated with a control order issued from a later mentioned control part 50. On the other hand, an alignment light source 30 is provided which simultaneously applies the alignment lights to the alignment patterns 2a of the mask A and to the alignment patterns 2b of the wafer B through the mask membrane 20. The alignment lights are obliquely incident into these patterns 2a, 2b. The reflected diffraction lights coming from the patterns 2a, 2b obliquely in response to said oblique incidences are respectively detected as interferometric images at a detector 4a of a pattern detecting system of the mask side and at a detector 4b of pattern detecting system of the wafer side, as only the reflected light coming from the patterns 2b of the wafer B are passing through the mask membrane 20. These detecting data are sent to the control part 50 and analyzed there, so that an amount of relative pattern displacement between the X-ray mask A and the wafer B is obtained. In accordance with the pattern displacement amount, the control part 50 issues control signals to the respective driving systems 12, 13 of the mask stage 10 and the wafer stage 11, and thus the position alignment is carried out therebetween. After the position alignment has been accomplished, a shutter 60 of the X-ray source 6 is opened for X-ray exposure.

In the above stated X-ray mask alignment system such as the as-placed alignment, for irradiating the alignment light of the wafer B to the alignment patterns 2b and reflecting the light therefrom, these lights should necessarily pass through the mask membrane 20. Therefore, the mask membrane 20 must be such substance having not only an X-ray transparency but also an alignment light transparency. Due to these restrictions, the substances as the membrane material are limited to SiN, SiC or the like, and have a further restriction that thickness be around 2 μm. Accordingly the mask membrane 20 is easily caused with distortions as bending, and an absorber pattern for replication (not shown) on the mask A and the position of the alignment pattern are varied, so that the precision of the mask is largely worsened, resulting in lowering the alignment accuracy.

SUMMARY OF THE INVENTION

The present invention has been devised in view of the prior art problems as above set forth, and it is an object of the invention to provide the X-ray mask alignment method and the apparatus therefor enabling to suppress to produce distortions of the mask as well as the X-ray mask to be used to said method and said apparatus.

The X-ray alignment method of a first invention is basically characterized by separately carrying out a process which irradiates the alignment lights to the alignment patterns of the X-ray mask and detects the reflected lights therefrom, and a process which directly irradiates the alignment lights to the alignment patterns of the wafer and detects the reflected light therefrom, and carrying out the position alignment of the X-ray mask and the wafer in accordance with the detecting data of these reflected lights.

A second invention relates to the apparatus for practising said alignment method, which is provided with a position alignment mechanism of the mask stage and the wafer stage, which moves the X-ray mask or/and the wafer and provides the position alignment therebetween, the alignment patterns respectively formed on the mask and the wafer, alignment light source independently provided for irradiating the alignment patterns of the X-ray side and the wafer side, detectors independently provided for detecting the reflected lights of the alignment patterns of the X-ray mask and the wafer, and a controller which analyzes the respective positions of the X-ray mask and the wafer in accordance with the reflected lights detecting data by each of the detectors, and issues position alignment control signals to said position alignment mechanism.

A third invention relates to the X-ray mask to be used to said alignment method and the apparatus, and is characterized in that the membrane material of said X-ray mask has only the X-ray transparency.

Since the irradiations of the alignment light therefrom to the wafer side and the detection of the reflected light therefrom are directly conducted not passing through the mask membrane, it is not necessary to pass the alignment light through the mask membrane, and accordingly ranges of selecting the materials to be the mask membrane are widened and the thickness thereof may be made large. As a result, distortions of the mask do not occur, and position accuracies of the patterns on the mask (absorber pattern for replication or alignment patterns) are improved and the alignment accuracies are heightened.

BRIEF DESCRIPTION OF THE DRAWINGS

FIG. 1 is an explanatory view showing one embodiment of the X-ray mask alignment apparatus of the second invention used in an X-ray stepper;

FIG. 2 is a cross sectional view showing the structure of the X-ray mask used in the apparatus of the above embodiment;

FIG. 3 is an explanatory view showing another embodiment of the second invention;

FIG. 4 is an explanatory view showing one example of the X-ray mask alignment method by the as-placed position alignment; and FIG. 5 is an explanatory view showing a further embodiment of the X-ray mask alignment apparatus used in the X-ray stepper.

In the drawings, 1 designates the position alignment mechanism, 10 is the mask stage, 11 is the wafer stage, 12, 13, 130 are driving systems, 2a, 2b are alignment patterns, 20 is the mask membrane, 3a, 3b, 30, 31 are light sources, 4a, 4b, 40, 41 are detectors, 5, 5a are controllers, 50 is a controller, A is the X-ray mask, and B is the wafer.

MOST PREFERRED EMBODIMENT FOR PRACTISING THE INVENTION

Embodiments of this invention will be explained with reference to the attached drawings.

FIG. 1 shows one embodiment of the X-ray mask alignment apparatus of the second invention used to the X-ray stepper where the reference numeral 60 designates a shutter for irradiating and interrupting the X-ray from an X-ray source 6, which is opened and closed by control signals from a later mentioned controller 5.

The apparatus of this embodiment includes an alignment mechanism 1 composed of the mask stage 10 of the X-ray mask A and the wafer stage 11 of the wafer B, the alignment patterns 2a and 2b respectively formed on the X-ray mask A and the wafer B, the alignment laser light sources 3a and 3b independently provided for irradiating said patterns 2a, 2b, detectors 4a and 4b for detecting the reflected lights respectively provided at the X-ray mask A side and the wafer B side in response to said sources 3a and 3b, and a controller 5 for issuing the control signals to the alignment mechanism 1 in accordance with detected results.

The mask stage 10 and the wafer stage 11 of the alignment mechanism 1 respectively include driving systems 12 and 13 which are controlled by the controller 5 for carrying out the alignment between the X-ray mask A and the wafer B.

The alignment patterns 2a and 2b are composed of reflection typed diffraction gratings at predetermined positions of the X-ray mask A and the wafer B.

The light sources 3a and 3b are placed on the under surface of the mask stage 10 and on the upper surface of the wafer stage 11 such that the oblique incidences of the laser lights therefrom may be 12° respectively with respect to the alignment patterns 2a and 2b. The angle of the oblique incidence of the laser light is 12° in the present embodiment, but of course not limited to this value. The angle of the oblique incidence may be determined at disposal by optical system settings.

The detectors 4a and 4b are obliquely arranged with respect to the mask stage 10 and the wafer stage 11 in response to the angles of the oblique incidences of the sources 3a and 3b, and operate oblique detections of the reflected diffraction lights from the alignment patterns 2a and 2b. The detected data thereof are converted into electrical signals and sent to the controller 5.

The controller 5 analyzes each of the positions of the X-ray mask A and the wafer B with reference to the detected data sent from the detectors 4a and 4b, calculates moving amounts required to the alignments between the mask stage 10 and the wafer stage 11, and issues alignment control signals to the driving systems 12 and 13 of the both stages.

FIG. 2 is the cross sectional view showing the structure of the X-ray mask A used to this embodiment, which is provided with the absorber pattern 21 for replication and the alignment patterns 2a on one of the surfaces of the mask membrane 20 directing to the wafer side, and secured with a supporter 22 on the circumference of the other surface. The mask membrane 20 is not composed of SiN or the like as the prior art, but composed of Be which has an X-ray transparency with an opacity for the alignment light. Further, it is as thick as 35 μm while the conventional ones are around 2 μm. Thus it is thickened more than one order. Used was the Be film formed by PVD (Physical Vapor Deposition) and etched back so as to sufficiently smoothen its surface. That is, the Be film was coated thereon with resist and subsequently carried out with an ion milling so as to sufficiently reduce unevenesses thereon.

Using manners of the apparatus of this embodiment will be explained.

At first, the mask stage 10 and the wafer stage 11 are withdrawn until positions where the alignment lights from the light sources 3a and 3b may be applied to the respective alignment patterns 2a and 2b, and the alignment lights are directly irradiated toward the alignment patterns 2a and 2b. Then, the diffraction lights reflected from the patterns 2a and 2b are independently detected at the respective detectors 4a and 4b, so that the positions of the X-ray mask A and of the wafer B are measured by the controller 5. In accordance with the measured values, the controller 5 controls the driving systems 12 and 13 of the mask stage 10 and the wafer stage 11 in order to slide the both stages in opposition each other, thereby to accomplish the alignment between the X-ray mask A and the wafer B. The X-ray exposure is made by opening the shutter 60.

For practising the alignment method, it is also possible to perform such as an alignment method by a statistical data processing of chip positions called as EGA (Enhanced Global Alignment) used in the optical lithography technique. That is, when the reflected diffraction light from the alignment pattern 2b of the wafer B is detected, the alignment pattern 2b of all or major parts of the chips on the wafer B is previously detected, and the position of each of the chips is in advance calculated by dealing with the statistical data processing. Thereafter, even if the detections were made inaccurate by roughnesses of the alignment patterns 2b provided on the wafer B due to influences of each process, the alignments could be carried out in accordance with the data of the statistical processings, thereby heightening the alignment accuracy. By losing the slope of the step patterns due to oxidation (the shape is like a bird's beak), grain growth by Al film, varies of the reflection rate by the film, varies of the reflection rate by light interferences within the film, or asymmetries of the sharp step pattern's shape caused by the spattering film, the alignment patterns 2b are worsened so that it is difficult to provide a position of a target to be aligned, resulting in causing detection errors, but even in such cases, if the detections are again made thereafter of the alignment patterns 2b of the chips on the wafer B and the statistical data processing thereof is made, the position of the target to be aligned can be presumed with the position data of the chips around this target, and thus the alignment accuracy is remarkably improved (in this sense, EGA is only for improving the detection accuracy of the target pattern on the wafer B, and not substantially relative with the improvement of the accuracy of the pattern position on the mask A as the present invention). Random errors in detecting the patterns will be reduced at a ratio of the following expression with respect to the measuring number n of the target pattern $$1/\sqrt{n}.$$

The alignment accuracy in the chip were investigated by carrying out the alignment of the X-ray mask with the apparatus used in this embodiment and repeating the X-ray exposure by the stepper. Results are shown in Table 1 in which the number of times denotes the exposure times, however since the number of times is counted per the unit of the wafer, the number of times of the X-ray exposure actually irradiated to the mask is about 35 times of the shown number. The number of 1000 denotes the alignment accuracy of the chip when the exposure of the 1000th wafer was made. The alignment pattern is arranged at the center of the X-ray mask. The comparative examples shown in the same are the results when the mask alignments were carried out by the prior art as-placed position alignment using the X-ray mask composed of the SiN membrane of 2 μm thickness.

TABLE 1

| Nt | A | B | C (μm) | D | E | F |
|---|---|---|---|---|---|---|
| Invention | | | | | | |
| 1 | −0.02 | −0.02 | 0.02 | 0.03 | 0.01 | 0.062 |
| 10 | −0.03 | −0.03 | 0.0 | 0.02 | 0.01 | 0.062 |
| 100 | −0.02 | −0.03 | 0.01 | 0.02 | 0.01 | 0.058 |
| 1000 | −0.04 | −0.03 | 0.02 | 0.04 | 0.02 | 0.094 |
| 10000 | −0.05 | −0.04 | −0.01 | 0.05 | 0.04 | 0.122 |
| Comparative Examples | | | | | | |
| 1 | 0.06 | 0.03 | −0.02 | 0.04 | 0.02 | 0.080 |
| 10 | 0.08 | 0.04 | 0.01 | 0.06 | 0.02 | 0.077 |
| 100 | 0.09 | 0.06 | 0.02 | 0.09 | 0.04 | 0.082 |
| 1000 | 0.11 | 0.12 | 0.0 | 0.08 | 0.13 | 0.141 |
| 10000 | 0.18 | 0.21 | −0.03 | 0.15 | 0.28 | 0.310 |

Note:
Nt ... Number of times
A ... Left-upper
B ... Right-upper
C ... Center
D ... Left-lower
E ... Right-lower
F ... Pattern displacement in the exposure field (3σ)

As apparently from the same, there are scarcely the chip pattern displacement in the exposure field in comparison with the comparative examples, and it is seen that the stable X-ray mask alignment is possible. The pattern displacement in the exposure field of 1 to 100 times in the comparative examples are around 0.08 μm which is larger than 0.06 μm of the present embodiment. As seen from the position data in detail, the circumference of the X-ray mask has tendency becoming larger in + direction in comparison with the center of the same. It is assumed that since the thin membrane is used, the pattern displacement in the exposure field are caused by the processes such as the etch back. If exceeding 1000 times, the pattern displacement in the exposure field abruptly becomes large. This is assumed that position displacements are increased by damages due to the X-ray irradiation. In the present embodiment, the position displacements are sufficiently forced down.

It is seen from the above stated results that the pattern position accuracy on the X-ray mask A is scarcely deteriorated in the present example, and since the Be film of 35 μm thickness was used as the mask membrane, the mask could be washed.

The thickness and the material are not limited to these 35 μm and Be as in this embodiment. For example, 20 μm and 50 μm are available. However, being too thin, the pattern displacement is easily caused, while being too thick, the transparency of the X ray is decreased, and in this case, it should be considered that a longer exposing time will be taken. In this regard, it may be one of merits of this invention that the accuracy of the pattern position detection does not depend upon the film thickness. As materials for the mask membrane, Al and Si may be used other than Be. When the mask is used in He or in a vacuum, Li and K may be used.

In the present example, the diffraction gratings are used for the alignment pattern, but not limited thereto. Such a material may be used which reflects and detects the alignment light, for example, which uses one groove or line or a cruciform alignment pattern, and detect an image through an optical imaging system.

FIG. 3 shows another X-ray mask alignment of a different structure from the above stated apparatus, where A designates an X-ray mask, B is a wafer, 11 is a wafer stage, 120 is a mask loader, 130 is a driving system for driving the wafer stage 11, 30, 31 are light sources for alignment, 40, 41 are detectors, 5a is a controller, and 70 is a frame. The loader 120 and the driving system 130 are secured on the frame 70, and the alignment light source 30 for detecting the mask position and the detector 40 are buried in the frame 70.

For using this apparatus, the loader 120 loads the X-ray mask A to the X-ray irradiation part, and at this position an accurate position of the X-ray mask A is measured by means of the alignment light source 30 and the detector 40. The wafer stage 11 is then withdrawn not to hinder the position detection, and during this withdrawing, a position of each of the chips is in advance grasped by means of the detector 41 and the alignment light source 31 for measuring the position of the wafer. The data of the mask position and the chip position are sent to the controller 5a, and analyzed. In accordance with the analyzed data, the control signal is output to the driving system 130 to move the wafer B to a desired position, and the shutter 60 is opened for the X-ray exposure.

In the present apparatus, since the X-ray mask A is fixed after it has been loaded by the loader 120 to the irradiation part, an alignment movable part is alignment with X, Y and θ axes of the wafer stage 11 only, so that the load to the machine precision is reduced as much.

For preventing distortions of the frame 70 by heatings from the alignment light sources 30, 31, it is of course desirable to provide temperature control around these light sources, or employ semi-conductor lasers of less heating amount.

In accordance with the present invention, the alignment patterns provided on the X-ray mask and the wafer are independently detected by sensing the reflecting lights, and the alignments are performed in accordance with the detected data. Therefore, it is not necessary that the X-ray mask is transparent for the alignment light, and such materials for the mask membrane are sufficient with those which are transparent and have irradiation endurance and are not bent. Since the restriction with respect to the mask membrane is not severe and the film may be made thick no problem is involved about the mask distortions which have conventionally been the greatest problem, and the accuracy of the pattern position on the mask is improved, and accordingly the alignment accuracy is improved.

FIG. 5 is concerned with one embodiment of the X-ray mask alignment device used in the X-ray stepper, in which a reference numeral 160 designates a shutter for irradiating or cutting off the X-ray from the X-ray source, which is opened and closed by control signals of a later mentioned controller 105.

The device of the present embodiment comprises an alignment mechanism 101 composed of a mask stage 110 of the X-ray mask A and a wafer stage 111 of the wafer B; an alignment mechanism 101; alignment patterns 140, 141 respectively formed on the X-ray mask A and the wafer B; an alignment light source 130; wavelength selecting mechanisms 131, 134; a lighting coherency adjustment mechanism 135; light irradiation lenses 132, 136; reflection light detectors 133, 137 separately provided at the X-ray mask side and the wafer side; and a controller 105 for issuing the control signals to the alignment mechanism 101 in accordance with detected data.

The mask stage 110 and the wafer stage 111 of the alignment mechanism 101 are respectively provided with drive systems 112, 113, and are controlled by the controller 105 for providing an alignment between the X-ray mask A and the wafer B. The alignment pattern 140 on the X-ray mask A is composed of diffraction gratings of a reflection type, and is disposed at a predetermined position on the X-ray mask A.

On the other hand, the alignment pattern 141 on the wafer B is composed of lines, slits and dot patterns, and is disposed at a predetermined position on the wafer B.

A light from the alignment light source 130 is divided into two, one of which is irradiated against the alignment pattern 140 on the x ray mask via the wavelength selecting mechanism 131 and the light irradiation lens system 132, and the other is irradiated against the alignment pattern 141 on the wafer B via the wavelength selecting mechanism 134 and the coherency adjustment mechanism 135.

A halogen light is used for the alignment light source 130, and the diffraction grating is used for the wavelength selecting mechanism 131, thereby enabling to take out a narrow-band light of 630 nm. For the wavelength selecting mechanism 134, a color glass filter and the diffraction grating are combined, so that those may be solely used respectively, or they may be used in combination. The light thus having passed through the wavelength selecting mechanism 134 may narrow and broaden a band and further may select a center wavelength therebetween. For the coherency adjusting mechanism, an iris is used, and the iris sizes may be variably determined at a desired value.

The irradiating lens 132 of the X-ray mask alignment pattern is installed under the mask stage such that said lens 132 may be provided a 12° oblique incidence of the light against the X ray mask alignment pattern 140, providing that this obliquity of 12° is only one practising condition, and may be optionally determined by an optical system setting. Said detector 133 is installed obliquely with respect to the mask stage 110 in response to said oblique incident angle of the light so as to carry out detections in an oblique direction of the diffraction lights from the alignment pattern 140, and detected data is converted into an electrical signal and sent to the controller 105.

The irradiation lens 136 of the wafer alignment is installed almost vertically with respect to the wafer alignment pattern 141 and above the wafer stage. A beam splitter 138 and the detector 137 are arranged such that the reflection light from the alignment pattern 141 is guided to the detector 137 via the beam splitter 138, and this detected data is also converted into an electrical signal and sent to the controller 105. Herein, a light fiber is employed as a means for transmitting the light from the light source 130 to the light irradiation lenses 132 and 136.

The controller 105 analyzes each position of the X ray mask A and the wafer B in accordance with detection data sent from the detectors 133 and 137 makes operations of moving amounts required to the alignments between the mask stage 110 and the wafer stage 111, and outputs alignment control signals to the driving systems 112 and 113 of both stages. By this signal, both driving systems are driven and the alignment is accomplished.

The X-ray mask used in the above stated device and the Example 1 was used to carry out the same experiment as in Example 1, and as a result, the high precision of the alignment was obtained with respect to changes with the passage of time similarly to Example 1. Further, the present embodiment exhibited merits as mentioned under.

Since, for detecting the X-ray mask alignment, a combination of a monochromatic light having high resolution and the diffraction grating pattern is used, the high precision of detecting the alignment is obtained. A problems involved with this system is that when the diffraction grating pattern being used for the alignment becomes a particular stepped pattern (for example, the step height "h" is m $$\frac{\lambda}{2n}.$$

Here, m is integer, $\lambda$ is wavelength of the detecting light, n is refractive index of the resist layer), a detecting light contrast is extremely lowered, and accordingly the alignment precision is lowered. Further, in case a film is formed on this pattern, and when this film has a particular thickness, intensity of the reflected light and contract thereof are largely decreased, and accordingly the alignment precision is lowered. In addition, when the film formed on the alignment pattern is transparent for the detected light, and is formed ununiformly with respect to the alignment pattern, the signal of the reflected light is disturbed by interference of the reflected light, and the alignment precision is decreased. However, since the X-ray mask has a structure where an absorber of a certain determined film thickness is formed, no matter is involved about these defects.

On the other hand, in regard to the wafer, the stepped pattern of the alignment pattern (mark) is different in dependence upon a device going to be made, and the films of several layers are often formed on the alignment pattern. Since the stepped pattern of the alignment mark is limited by structures of the device, the alignment device has to correspond to any of stepped patterns. The same is applied to the film thickness. The film has often large grains, or a transparent film is often asymmetrically covered thereon. Accordingly, for detecting the position of the wafer, the high precision of the alignment may not be often provided with the combination of the monochromatic light and the diffraction grating.

The detected light is dispersed by grains. The dispersed light becomes noises and lessens the detecting precision. Since the detected light causes multiple interferences within the film by the asymmetrically covered film, distributions of intensity of the reflected light is also accordingly made asymmetrical, and the center of the patter cannot be distinguished. Thus, the alignment precision is lowered.

For detecting the position of the wafer in the present device, the wavelength of the light, the width thereof and the coherency may be varied together with using the device for detecting the alignment pattern on the X-ray mask. The use in common with the light source is significant in term of decreasing costs of the device.

If an optimum wavelength of the detected light is selected, taking into consideration the stepped pattern of the alignment pattern and the film thickness thereon, it is possible to select preferable detected signals without decreasing intensity of the reflected light or contrast in company with the stepped pattern or the film. Specifically, such a wavelength was selected whose intensity of the reflected light and the contrast thereof were largest by changing the wavelength from 680 nm to 540 nm.

Next, the band width of the detected light was changed to select a band width by which the tubulent of the reflected light was made minimum. The narrower is the band width, the contrast of the reflected light is made larger by the light interference, however when the large grain on the alignment pattern are accompanied with the tubulents, the larger is the band width, the smaller is the tubulent of the signal.

Subsequently, the coherency of the detected light was changed to select such a coherency where a tubulency of the reflected light signal was minimum.

By the present method, it was possible to detect a position of the wafer alignment pattern in term of such an accuracy of 0.02 $\mu$m in Al or W of grain size being several ten to several hundred nm where the detection of the alignment pattern of the wafer was difficult in the prior art, the wafer which was formed with a film SOG (Spin on Glass) asymmetrically formed on polysilicon or $SWi_2$, and further the wafer formed with alignment pattern by silicon oxide film of 100 nm where the intensity of the reflection light was lowered with respect to the wavelength of 630 nm.

What is claimed is:

1. A method of aligning an X-ray mask with a wafer, comprising:
    providing an X-ray mask having a membrane transparent to only X-ray;
    directly irradiating an X-ray mask alignment pattern on said X-ray mask with a first light source;
    detecting light reflected from said X-ray mask alignment pattern;
    directly irradiating a wafer alignment pattern on said wafer with a second light source independent from said first light source;
    detecting light reflected from said wafer alignment pattern;
    comparing the detected light reflected from said X-ray mask alignment pattern with the light reflected from said wafer alignment pattern; and
    aligning said X-ray mask and said wafer based upon said comparison.

2. Aligning apparatus for alignment a mask with a wafer, comprising:
    first alignment light source means for independently directly irradiating an alignment light pattern formed on said mask;
    second alignment light source means for independently directly irradiating an alignment light pattern formed on said wafer;
    first detecting means for detecting light reflected from said alignment light pattern on said mask;
    second detecting means for detecting light reflected from said alignment light pattern on said wafer;
    means for comparing the respective positions of said mask and said wafer based upon said detected light reflected from said alignment light patterns on said mask and on said wafer; and
    means for aligning said mask with said wafer based upon said comparison.

3. The apparatus of claim 2, wherein said means for comparing the respective positions of said mask and said wafer comprises a controller which issues position alignment control signals to said means for aligning said mask with said wafer.

4. An alignment method for carrying out alignment between an X-ray mask formed with alignment marks and a wafer formed with alignment marks, comprising
    using, in the X-ray mask, a membrane having transparency of only X-ray,
    separately detecting alignment patterns on the X-ray mask and alignment patterns on the wafer,
    detecting the alignment patterns on the X-ray mask by irradiating lights from an alignment light source, via a first optical means which selects and passes therethrough lights of specific wavelength, against the alignment patterns on the X-ray mask, and by detecting reflection lights from the X-ray mask alignment patterns,
    detecting the alignment patterns on the wafer by irradiating lights from the alignment light source, via a second optical means which selects and passes therethrough lights in a zone of a desired wavelength, against the alignment patterns on the wafer and by detecting reflection lights from the alignment patterns on the wafer,
    comparing detected lights which are reflected from said X-ray mask alignment pattern with lights which are reflected from said wafer alignment pattern, and
    carrying out the alignment between the X-ray mask and the wafer in accordance with said comparison.

5. An alignment device for carrying out alignment between an X-ray mask formed with alignment marks and a wafer formed with alignment marks, comprising
    one alignment light source,
    a first optical means for selecting and passing therethrough only lights of specific wavelength,
    a second optical means for selecting and passing therethrough only lights in a zone of a required wavelength,
    two detecting means for separately detecting alignment patterns on the X-ray mask and alignment patterns on the wafer;

a means for comparing respective positions of the mask and the wafer in accordance with the detected lights reflected from the alignment patterns on the mask and the wafer; and a means for carrying out the alignment in accordance with said comparison, wherein the light from the alignment light source is irradiated against the alignment patterns on the X-ray mask via the first optical means which selects and passes therethrough the light of the specific wavelength, and the light reflected from the alignment pattern on the mask is detected by means of the first detecting means; the light from the alignment light source is irradiated against the alignment pattern on the wafer via the second optical means which selects and passes therethrough the light in the zone of the desired wavelength; and the reflected light from the alignment pattern on the wafer is detected by means of the second detecting means.

6. The device as claimed in claim 5, wherein the light from the alignment light source is irradiated against the alignment pattern on the wafer via the second optical means which selects and passes therethrough the light in the zone of the desired wavelength, and via a variable iris which can variably change lighting coherency, and the reflected light from the alignment pattern on the wafer is detected by the second detecting means.

* * * * *